(12) United States Patent
Zhu et al.

(10) Patent No.: US 9,818,816 B2
(45) Date of Patent: Nov. 14, 2017

(54) METAL CAPACITOR DESIGN FOR IMPROVED RELIABILITY AND GOOD ELECTRICAL CONNECTION

(71) Applicant: GLOBALFOUNDRIES Inc., Grand Cayman (KY)

(72) Inventors: Jianhong Zhu, Austin, TX (US); James F. Buller, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 316 days.

(21) Appl. No.: 13/716,693

(22) Filed: Dec. 17, 2012

(65) Prior Publication Data

US 2013/0105944 A1   May 2, 2013

Related U.S. Application Data

(62) Division of application No. 12/615,796, filed on Nov. 10, 2009, now Pat. No. 8,357,584.

(51) Int. Cl.
| | |
|---|---|
| *H01L 21/02* | (2006.01) |
| *H01L 49/02* | (2006.01) |
| *H01L 23/522* | (2006.01) |

(52) U.S. Cl.
CPC .......... *H01L 28/40* (2013.01); *H01L 23/5223* (2013.01); *H01L 2924/0002* (2013.01)

(58) Field of Classification Search
CPC .................. H01L 23/5223; H01L 28/40; H01L 2924/0002

USPC .......................................................... 257/534
See application file for complete search history.

(56) References Cited

U.S. PATENT DOCUMENTS

| | | | | |
|---|---|---|---|---|
| 7,960,811 B2* | 6/2011 | Kim | ............................. | 257/532 |
| 2009/0009926 A1* | 1/2009 | Baumgartner et al. | ....... | 361/303 |

* cited by examiner

*Primary Examiner* — Laura Menz
*Assistant Examiner* — Candice Y Chan
(74) *Attorney, Agent, or Firm* — Ditthavong & Steiner, P.C.

(57) ABSTRACT

A metal capacitor is formed with good conductivity for both nodes of the capacitor and improved reliability. An embodiment includes a first layer of alternating first and second metal lines, a second layer of alternating third and fourth metal lines, a dielectric layer between the first and second layers, and vias in the dielectric layer connecting the first and second metal lines with the third and fourth metal lines, respectively, wherein each metal line comprises alternating first segments having a first width and second segments having a second width, the first width being greater than the second width, each first segment lying adjacent to a second segment of an adjacent metal line, and only first segments of the metal lines overlapping the vias. The design enables the spacing between metal lines to be maintained, the spacing between via to metal to be increased, and via connection to be maintained for both nets, thereby improving the conductivity and reliability of the capacitor and maintaining capacitance density.

9 Claims, 6 Drawing Sheets

METAL CAPACITOR DESIGN FOR IMPROVED RELIABILITY AND GOOD ELECTRICAL CONNECTION

CROSS-REFERENCE TO RELATED APPLICATIONS

This application is a divisional of pending U.S. application Ser. No. 12/615,796 filed Nov. 10, 2009, the disclosure of which is incorporated herein, in its entirety by reference.

TECHNICAL FIELD

The present disclosure relates to metal capacitors in semiconductor devices. The present disclosure is particularly applicable to metal capacitors in semiconductor devices for 32 nanometer (nm) technology node and beyond.

BACKGROUND

The semiconductor or integrated circuit (IC) industry constantly strives to manufacture ICs with higher and higher densities of devices on a smaller chip area to achieve greater functionality and to reduce manufacturing costs. This drive for large scale integration has led to a continued shrinking of circuit dimensions and device features. However, as device features become smaller, required device performance and functionality have increased. For example, capacitors, which are typical devices integrated into ICs, are becoming smaller and smaller but still need to have a high capacitance.

A vertically stacked, intralevel interdigitated metal capacitor may be formed to filter out noise in a circuit. The capacitor must have a low resistance and high reliability. As the dimensions of the capacitor are reduced, the charge storage of the capacitor is also decreased. To improve the electrical conductivity of the metal capacitor, efforts have been made to form dense vias connecting metals on both nodes of the capacitor, as illustrated in FIG. 1, wherein vertical lines 101 alternate with lines 103, forming a comb structure. Similarly, horizontal lines 105 alternate with lines 107 to form a second comb structure. Vias 109 interconnect lines 101 and 105, and vias 111 interconnect lines 103 and 107. As such, lines 101 and 105 are wired together and connected to a positive voltage outside the comb, thereby forming a first net, and lines 103 and 107 are wired together and connected to a negative voltage outside the comb, thereby forming a second net.

Trenches for the metal lines and integral holes for the vias are typically formed by a dual damascene process. As a result, the vias have a tapered profile, in which the top of the via is larger than the trench, thereby reducing the space between the via and neighboring metal lines of a different net and between vias of different nets. If the space becomes too small, leakage and shorts occur. In addition, it is difficult to control the via profile, which causes reliability issues.

To avoid shorts, the space between adjacent metal lines may be increased. However, an increase in spacing expands the total area of the capacitor and decreases the capacitance per unit area (the capacitance density).

To improve reliability, efforts have been made to form vias only on metal lines of one of the two nodes. As illustrated in FIG. 2, wide vertical lines 201 alternate with narrow vertical lines 203, and wide horizontal lines 205 alternate with narrow lines 207. Lines 201 are interconnected with lines 205 through vias 209, and each of lines 201 and 205 is connected to one potential (e.g. a positive voltage (not shown)). However, lines 203 and 207 are only connected to each other and to a different potential (e.g. a negative voltage) at their line ends, at 211. By decreasing the width of lines 203 and 207 and not forming vias with the narrow lines, metal-to-metal spacing can be maintained, and via to metal spacing is increased. However, although this type of design improves reliability, it reduces the via density, particularly that of lines 203 and 207, thereby degrading electrical connection. In addition, the narrow lines have a higher resistance, thereby introducing a significant intrinsic resistance into the chip, particularly when the capacitor size is large.

A need therefore exists for a metal capacitor with improved reliability while maintaining good conductivity for both nodes of the capacitor.

SUMMARY

An aspect of the present disclosure is a semiconductor device comprising a metal capacitor with increased via density and improved reliability.

Another aspect of the present disclosure is a method of fabricating a semiconductor device comprising a metal capacitor with increased via density and improved reliability.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming alternating first and second metal lines on a substrate, each metal line comprising alternating first and second segments, the first segments having a first width, the second segments having a second width, the first width being greater than the second width; forming a dielectric layer over the first and second metal lines; forming vias in the dielectric layer over first segments of the first and second metal lines; forming alternating third and fourth metal lines on the dielectric layer, each metal line comprising alternating first and second segments, the first segments having the first width and overlying the vias, the second segments having the second width; wherein each first segment lies adjacent to a second segment of an adjacent metal line, and the vias connect first and second metal lines with third and fourth metal lines, respectively.

Aspects of the present disclosure include a method wherein the first width is about 1.2 to about 3 times the second width, e.g. about 1.2 to about 2 times the second width. Further aspects include a method wherein a length of each first segment is substantially equal to a length of each second segment. Other aspects include forming the first and second metal lines at an angle, such as 45° or 90°, to the third and fourth metal lines. Another aspect includes forming the third and fourth metal lines and the vias by a dual damascene process. An additional aspect includes connecting the first and third metal lines to a first potential and the second and fourth metal lines to a second potential different from the first.

Another aspect of the present disclosure is a metal capacitor comprising: a first layer of alternating first and second metal lines; a dielectric layer over the first layer; a second layer of alternating third and fourth metal lines over the dielectric layer, wherein each first, second, third, and fourth metal line comprises alternating first and second segments, the first segments having a first width, the second segments having a second width, the first width being greater than the second width, and each first segment lies adjacent to a second segment of an adjacent metal line; and vias in the dielectric layer connecting the first and second metal lines with the third and fourth metal lines, respectively, wherein only the first segments of the metal lines overlap the vias.

Aspects include a capacitor wherein the first width is about 1.2 to about 3 times the second width, for example about 1.2 to about 2 times the second width. Further aspects include a capacitor wherein the first width is about 70 nm, the second width is about 50 nm, and a space between adjacent metal lines is about 50 nm. Another aspect includes a capacitor wherein a length of each first segment is substantially equal to a length of each second segment. Other aspects include a capacitor wherein the first and second metal lines are at an angle, e.g. 45° or 90°, to the third and fourth metal lines. An additional aspect includes a capacitor wherein the first and second segments of the first and second metal lines substantially overlie the third and fourth segments, respectively. A further aspect includes a capacitor wherein the first and third metal lines are at a first potential and the second and fourth metal lines are at a second potential different from the first.

Another aspect of the present disclosure is a method of fabricating a semiconductor device comprising: forming alternating first and second metal lines on a substrate, each metal line comprising alternating first and second segments, the first segments having a first width, the second segments having a second width, the first width being about 1.2 to about 2 times the second width; forming an inter layer dielectric over the first and second metal lines; performing a dual damascene process to form vias in the dielectric layer over first segments of the first and second metal lines and to form alternating third and fourth metal lines on the dielectric layer, perpendicular to the first and second metal lines, each third and fourth metal line comprising alternating first and second segments, the first segments having the first width and overlying the vias, the second segments having the second width; wherein each first segment lies adjacent to a second segment of an adjacent metal line, and the vias connect first and second metal lines with third and fourth metal lines, respectively.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
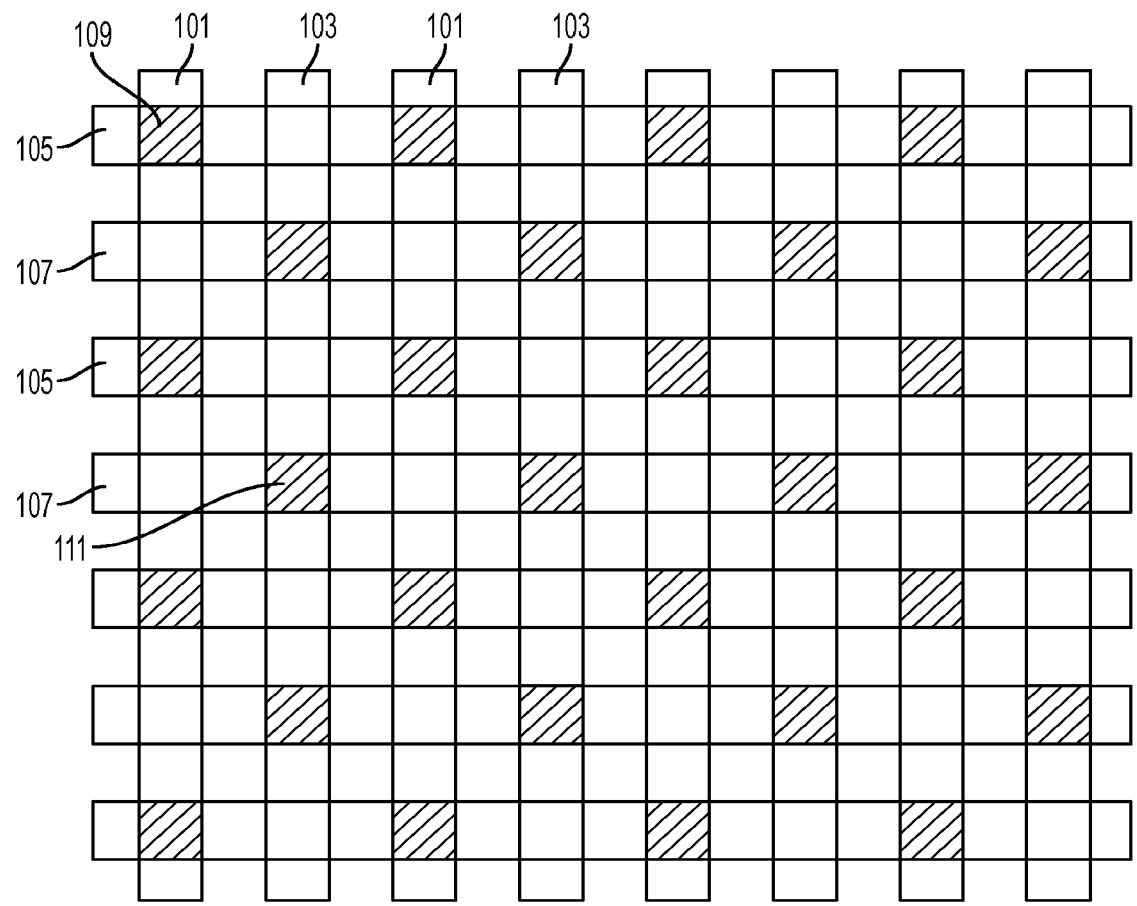
FIG. 1 schematically illustrates a metal capacitor with dense vias connecting metals on both nodes of the capacitor.
Figure 2:
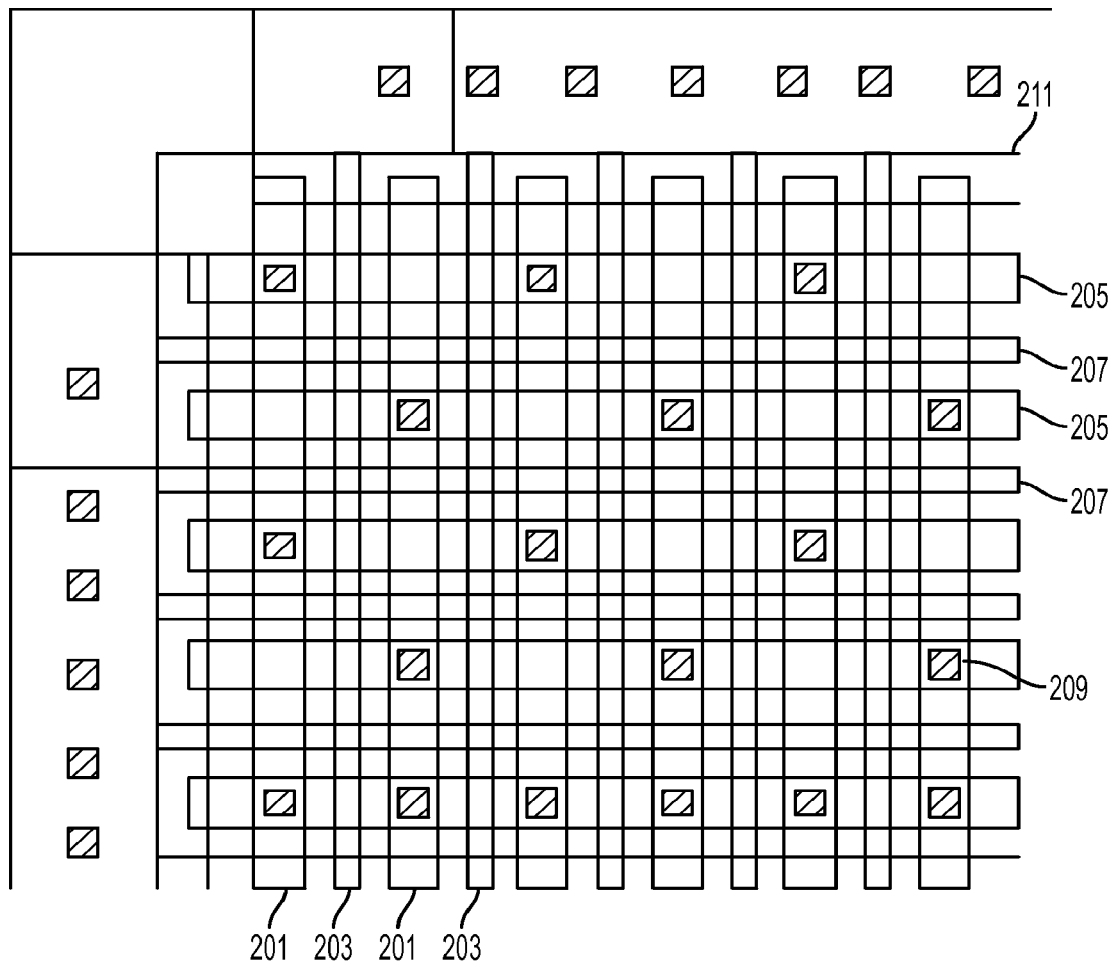
FIG. 2 schematically illustrates a metal capacitor with vias implemented only on one capacitor node.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of shorts and leakage in a metal capacitor as via density is increased. In accordance with embodiments of the present disclosure, metal lines are formed with alternating wide and narrow segments, with vias connecting only the wide segments, but for both nets. Consequently, the spacing between adjacent metal lines is maintained and therefore capacitance density is not degraded much. The spacing between vias and metal lines from different nets is increased, and therefore shorts are avoided and good reliability is maintained. Both nets are vertically connected by vias, so good electrical connection is maintained.

Methodology in accordance with embodiments of the present disclosure includes forming alternating first and second metal lines on a substrate, with each metal line including first segments having a first width and second segments having a second width, the first width being greater than the second width, e.g., 1.2 to 3 times the second width, and forming a dielectric layer over the first and second metal lines. Vias are formed in the dielectric layer over first segments of the first and second metal lines. Third and fourth metal lines are formed on the dielectric layer, each metal line including first segments having the first width and overlying the vias and second segments having the second width, such that each first segment lies adjacent to a second segment of an adjacent metal line, and the vias connect first and second metal lines with third and fourth metal lines, respectively. The third and fourth metal lines and the vias may advantageously be formed together by a dual damascene process. The first and third metal lines may be connected to a first potential, forming one node of the capacitor, and the second and fourth metal lines may be connected to a second potential, different from the first, thereby forming the second node of the capacitor. Embodiments include the first and second metal lines being formed at an angle to the third and fourth metal lines, e.g., about 45° or about 90°. The length of each first segment may be substantially equal to a length of each second segment.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3A:
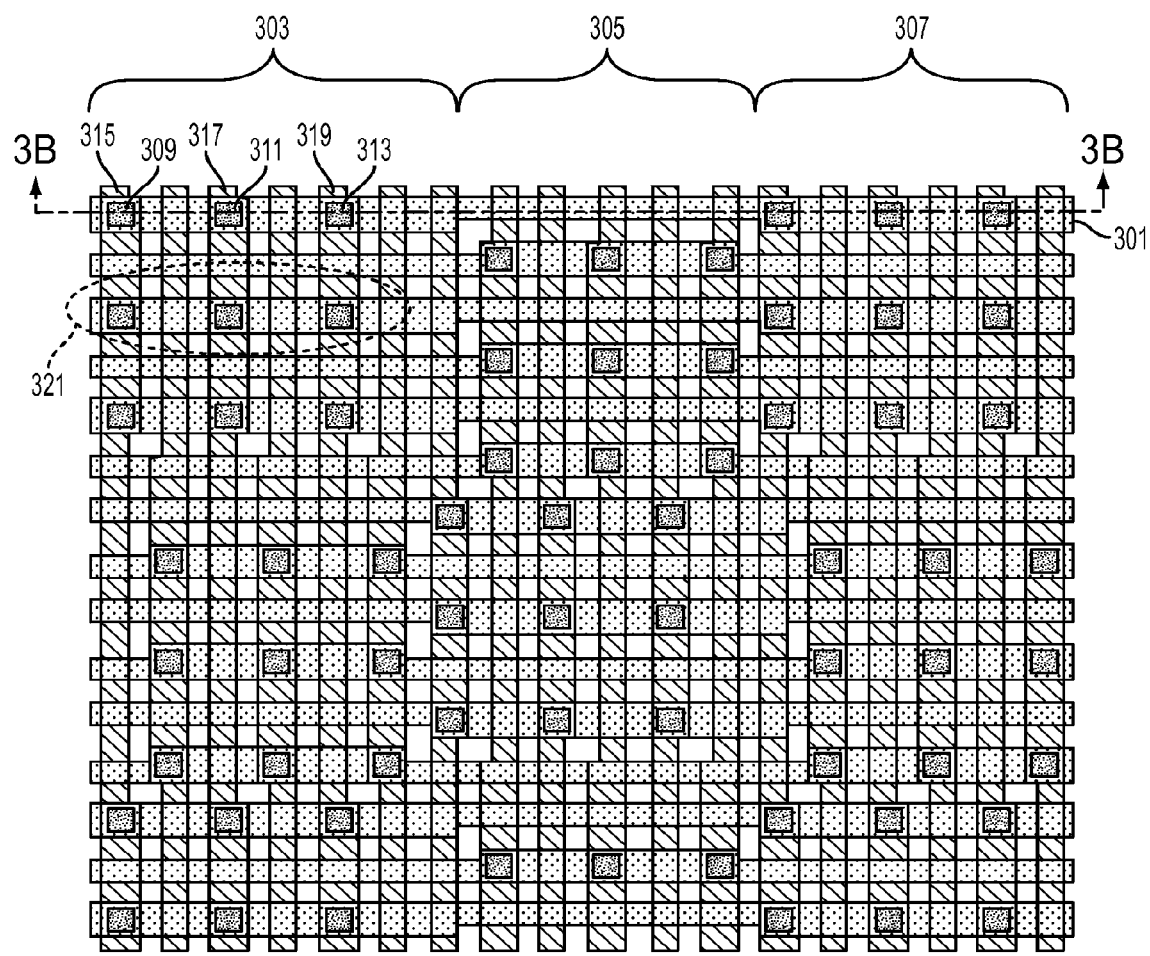
FIG. 3A is a schematic representation of a metal capacitor in accordance with an exemplary embodiment.

Adverting to FIG. 3A, a metal capacitor in accordance with an exemplary embodiment is shown. As illustrated, horizontal line 301 has a first wide segment 303, a narrow segment 305, and a second wide segment 307. The width of the wide segments may be about 1.2 to 3, e.g., 1.2 to 2, times the width of the thin segments. For example, for 32 nm node technology, the wide segments may have a width about 70 nm, the narrow segments may have a width about 50 nm, and the space between adjacent metal lines may be about 50 nm. Each wide segment is adjacent at least one narrow segment of a neighboring line, such that the decreased width of the narrow segment compensates for the increased width of the wide segment, allowing the metal spacing therebetween to be maintained but via to metal spacing to be increased.

Segment 303 has three vias, 309, 311, and 313, connecting line 301 to vertical lines 315, 317, and 319, respectively. Like the horizontal lines, each vertical line has alternating narrow and wide segments, and the vias only connect wide segments on the horizontal lines to wide segments of the vertical lines. No vias are formed between a metal line and a narrow segment. Segment 307, like segment 303, has three vias connecting line 301 to underlying wide portions of vertical lines. Oval 321 indicates that all vias on a single wide segment form a separate same net via domain. Although the domains are shown with three vias, the number of vias per domain is not so limited.

Every other horizontal line starting with line 301 and every other vertical line starting with line 309 are connected to a high potential, not shown. Intervening horizontal and vertical lines are connected to a low potential, not shown.

Figure 3B:
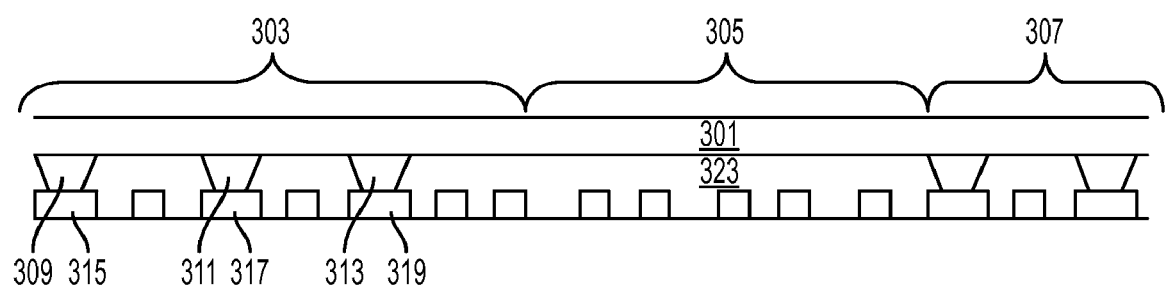
FIG. 3B is a cross-sectional view of the metal capacitor of FIG. 3A.

FIG. 3B illustrates a cross-section of the metal capacitor of FIG. 3A at line 301. As illustrated, segment 303 of horizontal line 301 is connected through interlayer dielectric 323 to vertical lines 315, 317, and 319 by vias 309, 311, and 313, respectivley. Segment 305 of vertical line 301 is not connected to any vertical lines, as segment 305 is a narrow portion of line 301. Wide segment 307 of line 301, like segment 303, connects to wide portions of intersecting vertical lines by vias therebetween. The vertical and horizontal lines may be formed as part of a metal 1 layer and metal 2 layer, respectively. In addition, the vias and horizontal lines may be formed together using a dual damascene process. Such a technique causes the vias to have a tapered shape, with the top of the via being larger than the bottom of the via, as indicated in FIG. 3B. Although shown as horizontal and vertical lines in FIGS. 3A and 3B, lines 301 and 309, for example, may intersect at an angle other than 90°, e.g., about 45°.

Figure 4A:
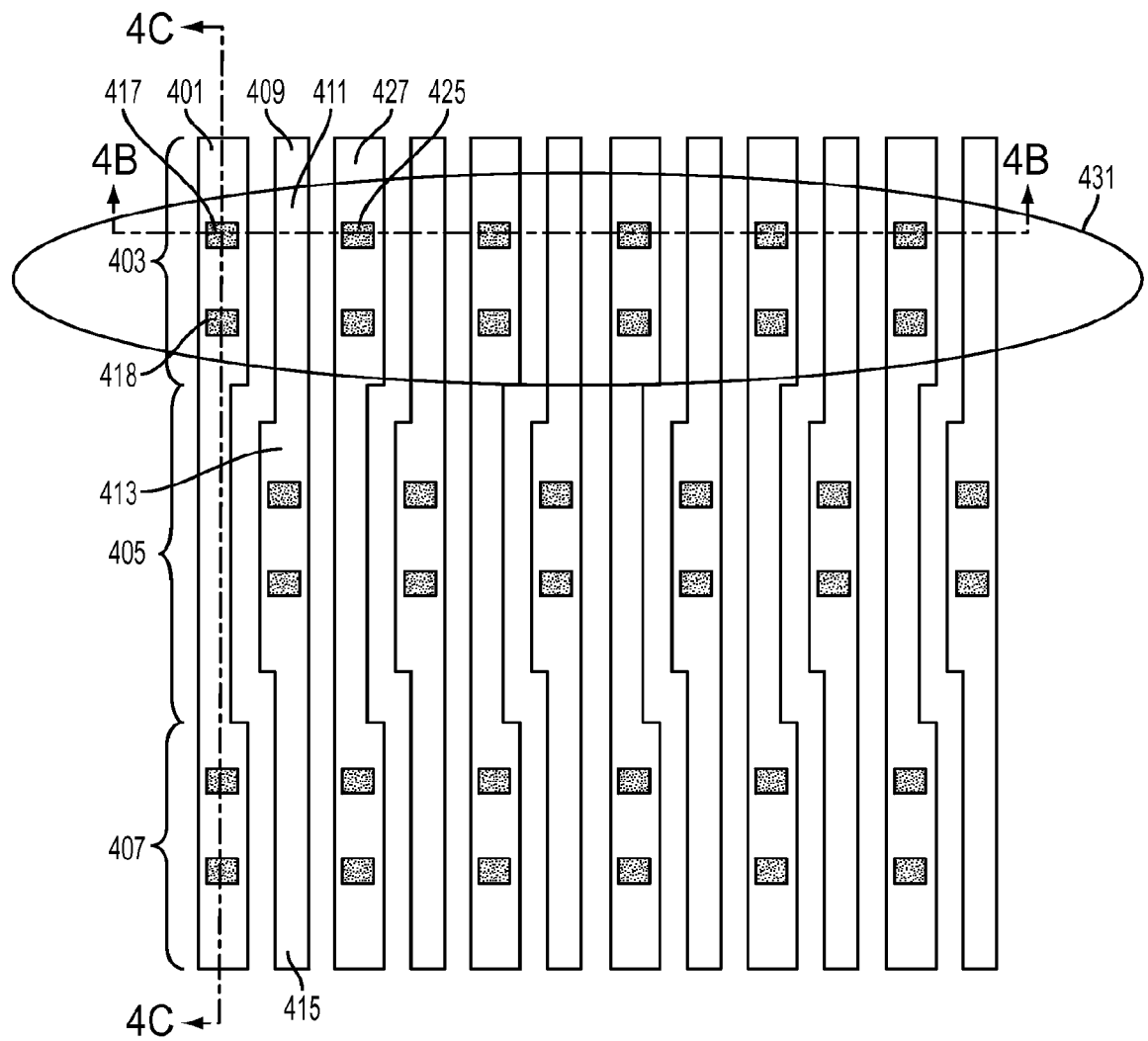
FIG. 4A is a schematic representation of a metal capacitor in accordance with another exemplary embodiment.
Figure 4B:
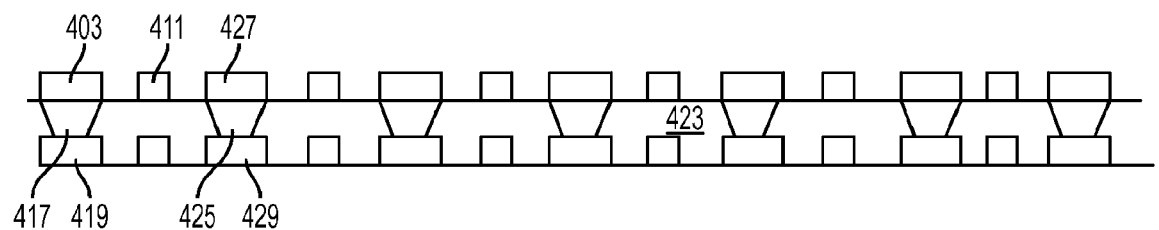
FIG. 4B is a cross-sectional view of the metal capacitor of FIG. 4A along line B-B.
Figure 4C:
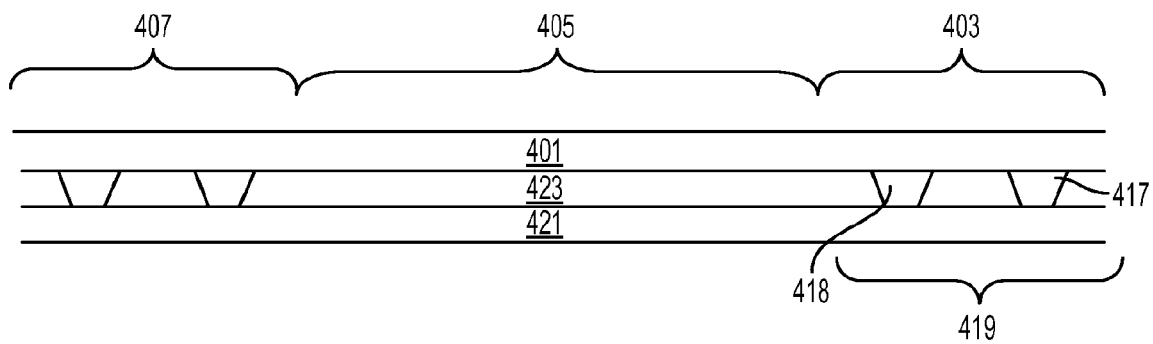
FIG. 4C is a cross-sectional view of the metal capacitor of FIG. 4A along line C-C.

FIGS. 4A-4C illustrate another exemplary embodiment in which the metal lines on one level may be overlapped in the same orientation with the metal lines on another level. FIG. 4A shows a top view, FIG. 4B illustrates a cross-sectional view along line B-B, and FIG. 4C shows a cross-sectional view along line C-C.

Adverting to FIG. 4A, each line has alternating wide and narrow segments, with each wide segment being adjacent at least one narrow segment to maintain the spacing therebetween. For example, line 401 has a first wide segment 403, a narrow segment 405, and a second wide segment 407. Line 409 has a first narrow segment 411, a wide segment 413, and a second narrow segment 415, such that each wide segment of line 401 is adjacent a narrow segment of line 409 and vice versa. Wide segments are connected to corresponding wide segments on an adjacent level with vias. For example, as illustrated in FIGS. 4B and 4C, vias 417 and 418 connect segment 403 of line 401 to corresponding segment 419 of line 421, through interlayer dielectric 423. Similarly, via 425 connects wide segment 427 with corresponding wide segment 429. Oval 431 designates a same net via domain.

The embodiments of the present disclosure can achieve several technical effects, including higher via density on both nets, and thus improved electrical conductivity, with reduced leakage and shorts (because of increased via to metal spacing), and therefore improved reliability in a metal capacitor. The present disclosure enjoys industrial applicability in any of various types of highly integrated semiconductor devices employing metal capacitors.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A metal capacitor comprising:
   a first layer of alternating first and second substantially linear metal lines;
   a dielectric layer over the first layer;
   a second layer of alternating third and fourth substantially linear metal lines over the dielectric layer, wherein each first, second, third, and fourth metal line comprises alternating first and second segments, the first segments having a first width, the second segments having a second width, the first width being greater than the second width, and each first segment lies adjacent to a second segment of an adjacent metal line; and
   vias in the dielectric layer connecting the first and second metal lines with the third and fourth metal lines, respectively, wherein only the first segments of the metal lines overlap the vias,
   wherein the first width is about 70 nm, the second width is about 50 nm, and a space between adjacent metal lines is about 50 nm,
   the first and second metal lines are at an angle of 90° or less to the third and fourth metal lines, and
   at least one first segment of the third and fourth substantially linear metal lines extends over first segments of at least two of the first substantially linear metal lines, and over second segments of at least two of the second substantially linear metal lines.

2. The capacitor according to claim 1, wherein a length of each first segment is substantially equal to a length of each second segment.

3. The capacitor according to claim 1, wherein the first and second segments of the first and second metal lines substantially overlie the third and fourth segments, respectively.

4. The capacitor according to claim 1, wherein the first and third metal lines are at a first potential and the second and fourth metal lines are at a second potential different from the first.

5. A metal capacitor comprising:
   a first layer of alternating first and second substantially linear metal lines;
   a dielectric layer over the first layer;
   a second layer of alternating third and fourth substantially linear metal lines over the dielectric layer, wherein each first, second, third, and fourth metal line comprises alternating first and second segments, the first segments having a first width, the second segments having a second width, the first width being greater than the second width, and each first segment lies adjacent to a second segment of an adjacent metal line; and vias in the dielectric layer connecting the first and second metal lines with the third and fourth metal lines, respectively, wherein:

each first segment overlies plural vias, the first width is about 70 nm, the second width is about 50 nm, and a space between adjacent metal lines is about 50 nm, the first and second metal lines are at an angle of 90° or less to the third and fourth metal lines, and at least one first segment of the third and fourth substantially linear metal lines extends over first segments of at least two of the first substantially linear metal lines, and over second segments of at least two of the second substantially linear metal lines.

6. The capacitor according to claim 5, wherein a length of each first segment is substantially equal to a length of each second segment.

7. The capacitor according to claim 5, wherein the first and second segments of the first and second metal lines substantially overlie the third and fourth segments, respectively.

8. The capacitor according to claim 5, wherein the first and third metal lines are at a first potential and the second and fourth metal lines are at a second potential different from the first.

9. A metal capacitor comprising:

a first layer of alternating first and second substantially linear metal lines;

a dielectric layer over the first layer;

a second layer of alternating third and fourth substantially linear metal lines over the dielectric layer, wherein each first, second, third, and fourth metal line comprises alternating first and second segments, the first segments having a first width, the second segments having a second width, the first width being greater than the second width, and each first segment lies adjacent to a second segment of an adjacent metal line; and vias in the dielectric layer connecting the first and second metal lines with the third and fourth metal lines, respectively, wherein only the first segments of the metal lines overlap the vias and wherein each first segment overlies plural vias, wherein the first width is about 70 nm, the second width is about 50 nm, and a space between adjacent metal lines is about 50 nm, the first and second metal lines are at an angle of 90° or less to the third and fourth metal lines, and at least one first segment of the third and fourth substantially linear metal lines extends over first segments of at least two of the first substantially linear metal lines, and over second segments of at least two of the second substantially linear metal lines.

* * * * *